(12) United States Patent
Ginn et al.

(10) Patent No.: US 7,592,594 B2
(45) Date of Patent: Sep. 22, 2009

(54) METHOD OF CONSTRUCTION OF CTE MATCHING STRUCTURE WITH WAFER PROCESSING AND RESULTING STRUCTURE

(75) Inventors: Robert P. Ginn, Ventura, CA (US); Kenneth A. Gerber, Santa Maria, CA (US)

(73) Assignee: Raytheon Company, Waltham, MA (US)

( * ) Notice: Subject to any disclaimer, the term of this patent is extended or adjusted under 35 U.S.C. 154(b) by 281 days.

(21) Appl. No.: 11/598,492

(22) Filed: Nov. 13, 2006

(65) Prior Publication Data

US 2008/0113495 A1    May 15, 2008

(51) Int. Cl.
*H01L 25/00* (2006.01)
(52) U.S. Cl. .......... 250/332; 250/338.4; 250/352; 250/370.01; 257/436; 257/469; 257/E25.006; 438/68; 438/113
(58) Field of Classification Search .......... 257/708–711, 257/E25.006; 250/332
See application file for complete search history.

(56) References Cited

U.S. PATENT DOCUMENTS

| | | | |
|---|---|---|---|
| 5,264,699 A | 11/1993 | Barton et al. | 250/338.4 |
| 5,308,980 A * | 5/1994 | Barton | 250/338.4 |
| 5,672,545 A | 9/1997 | Trautt et al. | 437/209 |
| 6,417,514 B1 * | 7/2002 | Eneim et al. | 250/352 |
| 2004/0207074 A1 * | 10/2004 | MacDonald et al. | 257/708 |
| 2008/0057625 A1 * | 3/2008 | Chan et al. | 438/113 |

* cited by examiner

*Primary Examiner*—Angel Roman
(74) *Attorney, Agent, or Firm*—Harrington & Smith, PC

(57) ABSTRACT

A method includes bonding a first side of a metal shim to a silicon shim, removing metal from the metal shim to form a plurality of cleared metal lanes in accordance with a pattern, bonding a readout integrated circuit having a plurality of saw lanes in accordance with the pattern to a second side of the metal shim to form a wafer assembly wherein the plurality of saw lanes is aligned with the plurality of cleared metal lanes, and dicing the wafer assembly.

7 Claims, 19 Drawing Sheets

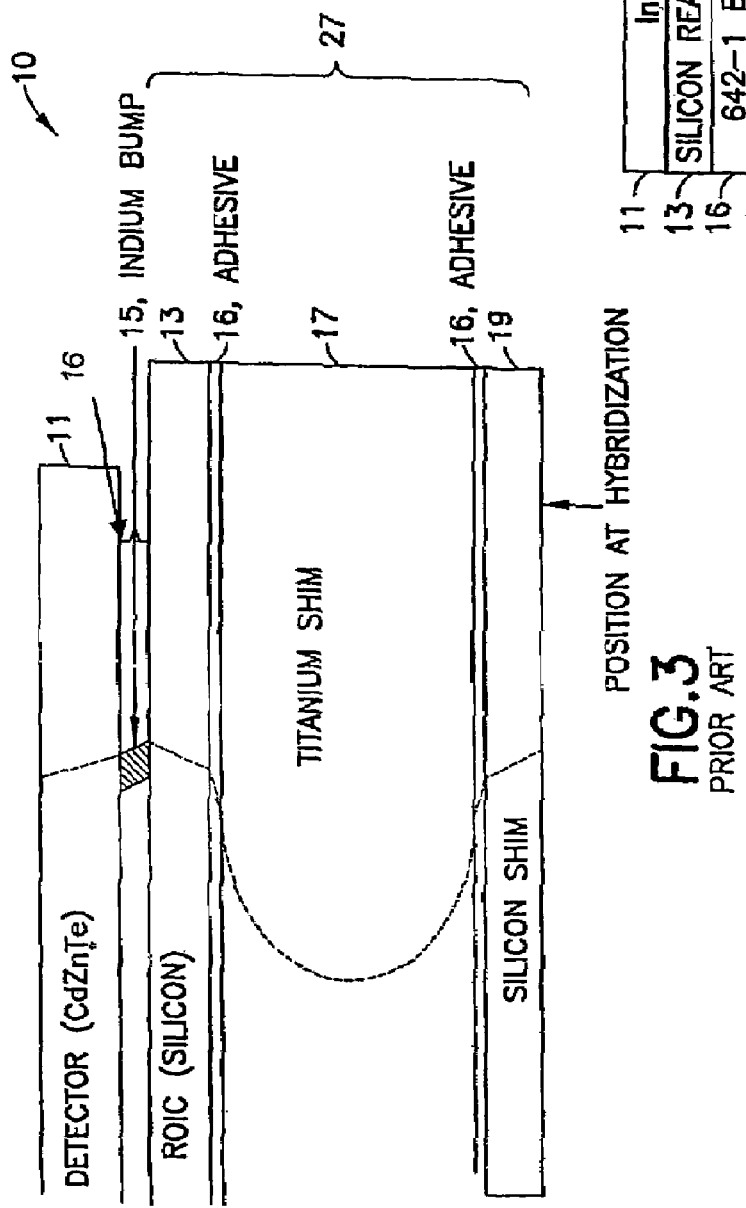

| ANSYS MATERIAL NO. | MATERIAL | COMPONENT | CTE(300->77K) [in/inK] | YOUNG'S MODULUS [psi] | POISON'S RATIO [1] |
|---|---|---|---|---|---|
| 18 | InSb | DETECTOR | 3.980E-06 | 6.21E+06 | 0.3 |
| 47 | GA47 | DETECTOR BUMP BACKFILL | 4.654E-05 | 6.33E+05 | 0.4 |
| 51 | SILICON | ROIC AND Si SHIM | 1.133E-06 | 1.90E+07 | 0.286 |
| 81 | ALUMINUM NITRIDE(AlN) | LCC | 1.408E-06 | 4.00E+07 | 0.25 |
| 642 | 642-1 ADHESIVE | GREATOP BONDLINES | 3.590E-05 | 7.53E+05 | 0.4 |
| 177 | 17-7 SS | SS SHIM | 8.610E-06 | 2.90E+07 | 0.29 |
| 280 | 280A ADHESIVE | GREATOP TO LCC BONDLINE | 2.660E-04 | 5.00E+02 | 0.4 |

FIG.9

METHOD OF CONSTRUCTION OF CTE MATCHING STRUCTURE WITH WAFER PROCESSING AND RESULTING STRUCTURE

TECHNICAL FIELD

The exemplary and non-limiting embodiments of this invention relate generally to a method and apparatus for reducing thermal mismatches in wafer assemblies.

BACKGROUND

With reference to FIG. 1, there are illustrated the main components of an infrared sensor chip assembly 10 (SCA) as follows. A detector 11 (such as a CdZnTe detector 11) is coupled to a readout IC (ROIC) 13 via one or more indium interconnects (bumps) 15. The ROIC 13 is coupled to a platform 21 which is coupled to a coldfinger 25 via an endcap 23. The indium interconnects 15 are used to join the detector 11 to the ROIC 13. These indium interconnects 15 take the signals generated by the detector 11 pixels (not shown) and transfer them to the signal processing circuits contained in the ROIC 13. The hybridized detector 11/ROIC 13 may then be attached directly to the platform 21, such as by being adhesively attached.

During operation, SCA 10 is typically cooled to cryogenic temperatures (e.g., 70 K). As the SCA 10 is cooled to such temperatures, problems can arise when different components of the SCA 10 contract at different rates. For example, if the detector 11 is formed of CdZnTe, it will likely contract approximately four times faster than the silicon ROIC 13 to which it is coupled. This differential in contraction strains the indium interconnects 15, particularly at the corners of the detector 11. As the SCA 10 is cycled from ambient to operating temperatures, the indium interconnects 15 can experience substantial fatigue. If the strains experienced by the indium interconnects 15 are excessive, they may fail due to fatigue, usually starting at the corners of the detector 11 where the displacement differential is typically most severe.

One attempt to address this problem is the production of Glued REAdout to Platform (GREATOP) SCAs 10. As used herein "GREATOP" refers to the configuration of SCAs formed, generally, in accordance with the disclosures of U.S. Pat. Nos. 5,672,545 and 5,308,980. GREATOP SCAs 10 utilize a balanced silicon readout/titanium shim/silicon shim wafer assembly 27 to force the contraction of the ROIC 13, formed of silicon, to match that of the detector 11, which may be formed of CdZnTe.

With reference to FIG. 2, there is illustrated a cross section of a GREATOP SCA 10 showing the material expansion mismatches. The titanium shim 17 of the wafer assembly 27 has a thermal contraction rate that is approximately seven times greater than that of silicon. There is illustrated a vertical baseline indicating the alignment of components prior to contraction. As is evident from the horizontal, left pointing arrows, the displacements of the components experienced by unconstrained contraction vary considerably. The relatively high titanium contraction rate forces the silicon ROIC 13 to contract faster than it would by itself.

With reference to FIG. 3, there is illustrated a cross section of a GREATOP SCA 10 wherein the thickness of the titanium shim 17 is chosen so that the contraction of the silicon ROIC 13 approximately matches that of the CdZnTe detector 11. As noted above, this arrangement can greatly reduce, or theoretically eliminate, indium interconnect fatigue failure. The wafer assembly 27 may be further balanced by incorporating a silicon shim 19 below the titanium shim 17 to create an axial symmetry which prevents the GREATOP SCA 10 structure from bowing or warping.

The thermal mismatch between a detector 11 formed of InSb and an ROIC 13 is comparable to that of a detector 11 formed of CdZnTe. Historically, RVS InSb detectors 11 have not utilized a thermal shim concept because the indium interconnects 15 are wicked with adhesive 16 during production. The adhesive 16 wicked in between the detector 11 and ROIC 13 prevents de-hybridization at cooldown. While de-hybridization is not a problem for SDA, the thermal mismatch between the InSb detector 11 and Silicon ROIC 13 causes a substantial amount of detector cracking (up to a 15% yield loss) at initial cooldown.

In order to implement the GREATOP concept on existing products utilizing InSb detectors 11, the entire height of the wafer assembly 27 is designed to be approximately 0.0185 inches, that is, the height of current SDA silicon ROICs 13. In response to this constraint, a wafer assembly 27 structure has been devised of the materials illustrated in FIG. 4. With reference to FIG. 5, there is illustrated an InSb detector 11 showing the maximum principal stress in the InSb detector 11 when it is cooled from 300K to 77K on a leadless chip carrier (LCC). As shown, the maximum principal stress ranges to a high of ~5,300 psi.

With respect to FIG. 6, there is illustrated the field stress in an InSb detector 11 formed according to the structure illustrated in FIG. 4 and incorporating a reduced thickness titanium shim 17 when it is cooled from 300K to 77K on a leadless chip carrier (LCC). As shown, reducing the thickness of the titanium shim 17 reduces the maximal principal stress to approximately 0 psi. Unfortunately, constructing a sandwich 27 with a reduced titanium shim 17 thickness yields various manufacturing challenges. One significant challenge is maintaining detector flatness while bonding and curing the very thin wafer assembly 27.

SUMMARY

The foregoing and other problems are overcome, and other advantages are realized, in accordance with the exemplary embodiments of these teachings.

In accordance with an exemplary embodiment of the invention, a method includes bonding a first side of a metal shim to a silicon shim, removing metal from the metal shim to form a plurality of cleared metal lanes in accordance with a pattern, bonding a readout integrated circuit having a plurality of saw lanes in accordance with the pattern to a second side of the metal shim to form a wafer assembly wherein the plurality of saw lanes is aligned with the plurality of cleared metal lanes, and dicing the wafer assembly.

In accordance with an exemplary embodiment of the invention, a wafer assembly includes a metal shim having a first side comprising a plurality of cleared metal lanes arranged in accordance with a pattern and a second side, a silicon shim coupled to the second side of the metal shim, and a readout integrated circuit having a plurality of saw lanes arranged in accordance with the pattern coupled to the first side of the metal shim to form a wafer assembly wherein the plurality of saw lanes is aligned with the plurality of cleared metal lanes.

In accordance with an exemplary embodiment of the invention, an apparatus includes an infrared sensor assembly, a wafer assembly coupled to the infrared sensor assembly including, a 17-7 stainless steel shim having a first side and a second side, a silicon shim coupled to the second side of the metal shim, and a readout integrated circuit coupled to the first side of the metal shim.

In accordance with an exemplary embodiment of the invention, an apparatus includes an element for detecting infrared radiation, and an element for coupling the detecting element to a wafer assembly including a 17-7 stainless steel shim having a first side and a second side, a silicon shim coupled to the second side of the metal shim, and a readout integrated circuit coupled to the first side of the metal shim.

BRIEF DESCRIPTION OF THE DRAWINGS

The foregoing and other aspects of the exemplary embodiments of this invention are made more evident in the following Detailed Description, when read in conjunction with the attached Drawing Figure, wherein:

FIG. 3 is a cross section diagram of the SCA of FIG. 1 showing the effects of cooling.

FIG. 4 is an illustration of the materials used to form the SCA of FIG. 1.

FIG. 9 is a table of material specifications for the exemplary embodiment of a WACTEM wafer assembly of FIG. 8.

DETAILED DESCRIPTION

Exemplary and non-limiting embodiments of the invention disclose an infrared sensor chip assembly (SCA) 70, specifically a GREATOP SCA 70, wherein the Wafer Coefficient of Thermal Expansion Matching (WACTEM) wafer assembly 77 is formed of a metal containing, more preferably an iron-containing, and even more preferably a stainless steel-containing shim 81 coupled, on alternating sides, to both the silicon ROIC 73 and a silicon shim 79. As discussed more fully below, the use of the stainless steel shim 81 provides greater ease of manufacture compared to typical titanium shims 17, as well as improved physical characteristics.

Figure 18:
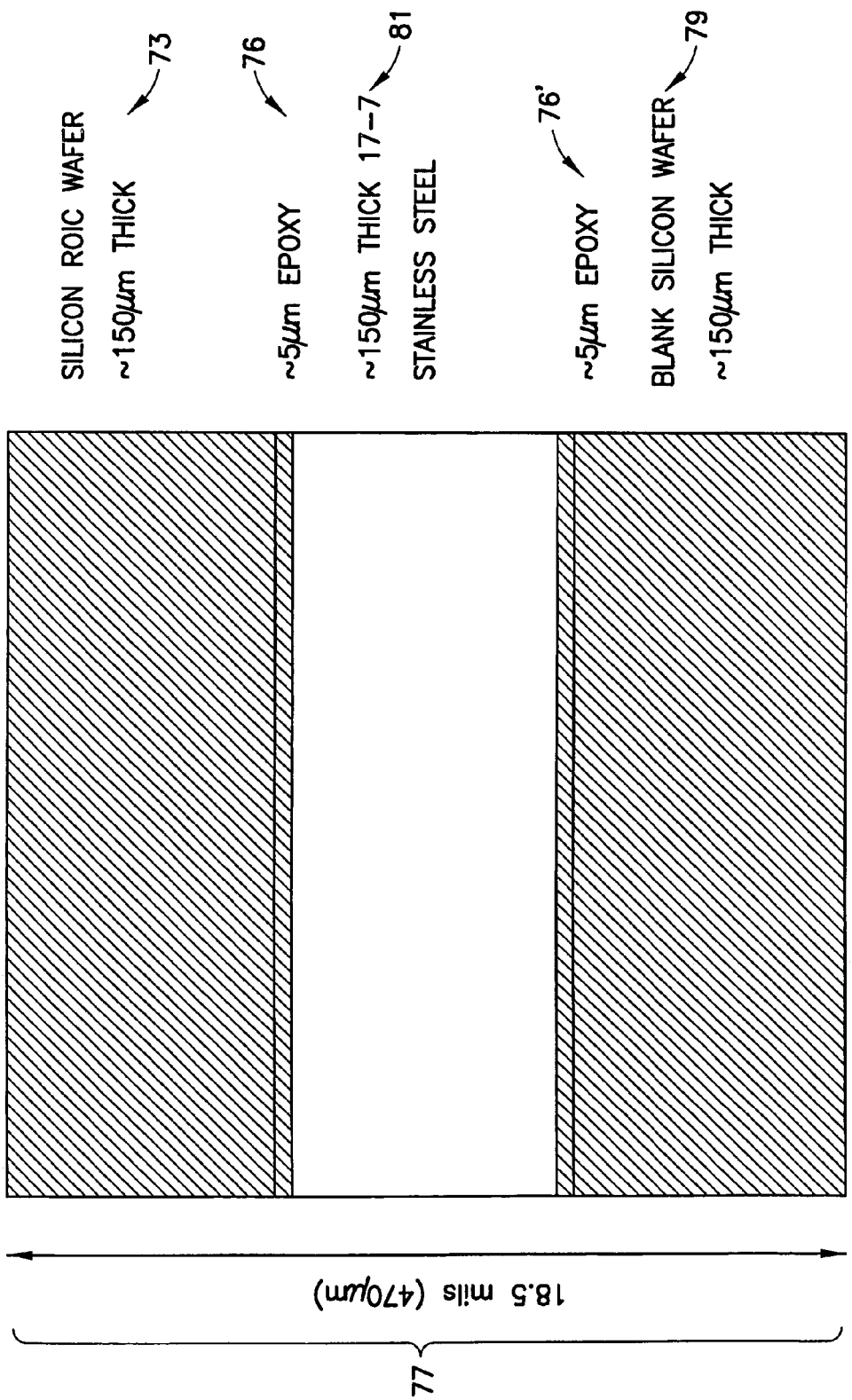
FIG. 18 is a cross-section view of a WACTEM wafer assembly according to an exemplary embodiment of the invention.

With reference to FIG. 18, there is illustrated an exemplary embodiment of a WACTEM wafer assembly 77 of the invention. WACTEM wafer assembly 77 is formed of three substantially planar layers. Specifically, a first layer is formed of the silicon ROIC 73 with a thickness of, by example, approximately 150 μm. One side of silicon ROIC 73 is coupled to a side of stainless steel shim 81 via an approximately 5 μm thickness epoxy layer 76. Stainless steel shim 81 in this non-limiting example is approximately 150 μm in thickness. A blank silicon wafer, silicon shim 79, is bonded to another side of the stainless steel shim 81 to form the WACTEM wafer assembly 77. As with the silicon ROIC 73, the silicon shim 79 is coupled to the stainless steel shim 81 via an epoxy layer 76 of approximately 5 μm in thickness. As described, the exemplary embodiment of the WACTEM wafer assembly 77 has an approximate thickness of 460 μm. Slight variations of the approximate component thicknesses described above yields an overall thickness of the WACTEM wafer assembly 77 of between approximately 460 μm and 470 μm.

As discussed more fully below, exemplary embodiments of the WACTEM wafer assembly 77 result in a composite WACTEM wafer assembly 77 with a coefficient of thermal expansion (CTE) of approximately $5 \times 10^{-6}$ m/m/°K. In addition, having an overall thickness of approximately 470 μm results in a WACTEM wafer assembly 77 having a composite structure that can be utilized in existing SCA 10 designs, does not require dewar redesign, is compatible with current processes, and exhibits die-flatness as required for flip-chip hybridization. Furthermore, the WACTEM wafer assembly 77 is compatible with currently used processes and parameters including, but not limited to, maximum temperature constraints and wafer singulation via dicing. In addition, the WACTEM wafer assembly 77 exhibits die flatness as may be required for flip-chip hybridization.

Figure 19:
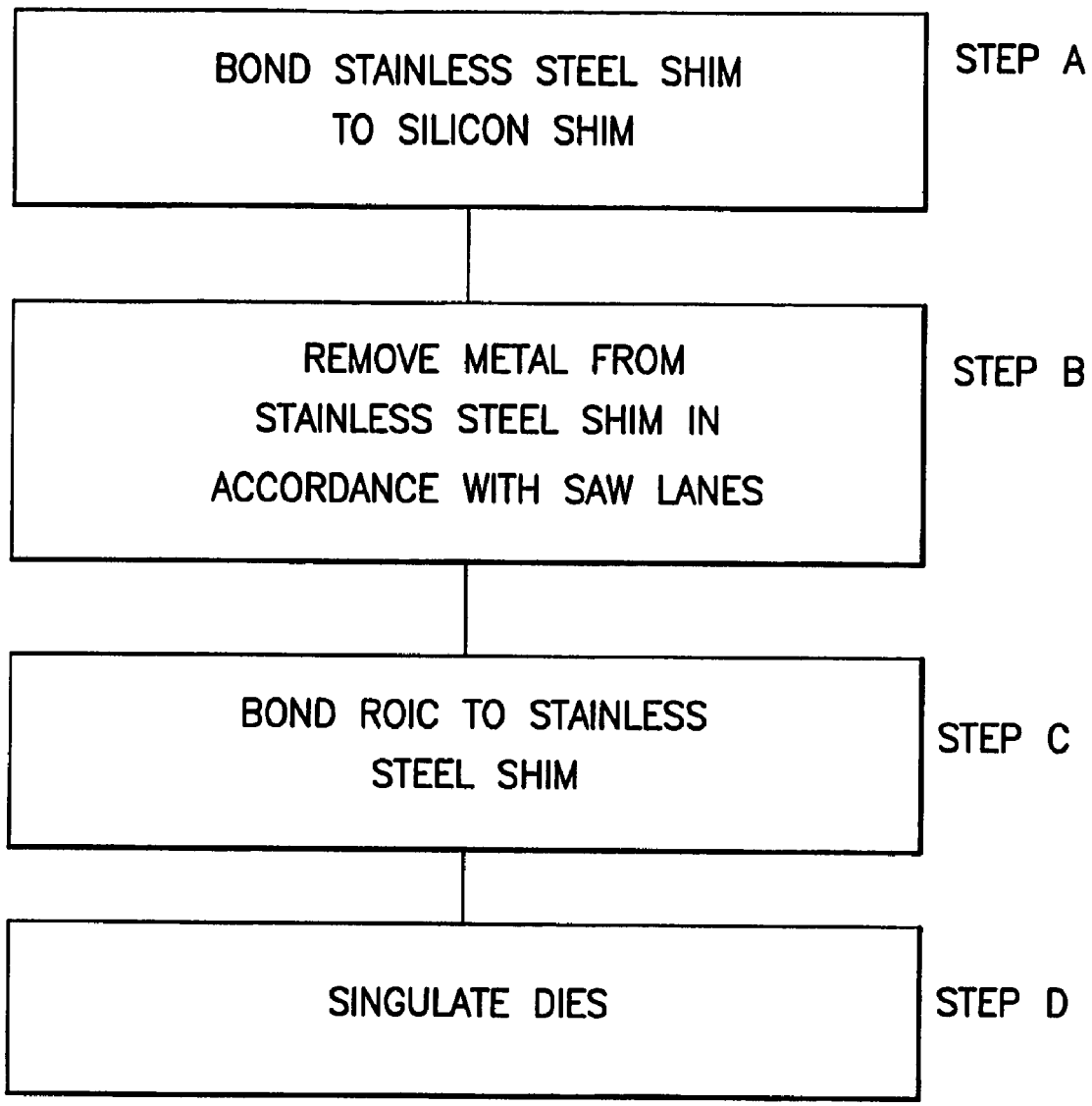
FIG. 19 is a flow chart of a method according to an exemplary embodiment of the invention.

With reference to FIG. 19, there is illustrated a flow chart of an exemplary method for fabricating a WACTEM wafer assembly 77 wafer according to exemplary embodiments of the invention. At step A, a stainless steel preform, forming the stainless steel shim 81, is bonded to silicon shim 79. The bonding can be achieved through the use of an epoxy 76'.

At step B, metal is removed from the stainless steel shim 81 in accordance with a saw lane pattern. Exemplary processes for removing the metal include, but are not limited to, photolithography and chemical etch processes. At step C, the saw lanes of the ROIC 73 are aligned with the cleared metal lanes on the stainless steel shim 81 and the ROIC 73 is bonded to the stainless steel shim 81, such as by epoxy 76.

At step D, individual dies, comprised of single WACTEM wafer assembly 77 structures are formed using a standard dicing process. Bonding at the wafer level and then dicing the balanced WACTEM wafer assembly 77 mitigates problems related to detector 11 flatness that can arise with the use of a titanium shim 17. In addition, titanium cannot be etched using the type of process described above. It is noted that the thermal contraction rate of 17-7 stainless steel at 8.61 E-6/K is but slightly higher than the value of 7.54E-6/K for titanium over the same temperature range.

Figure 24:
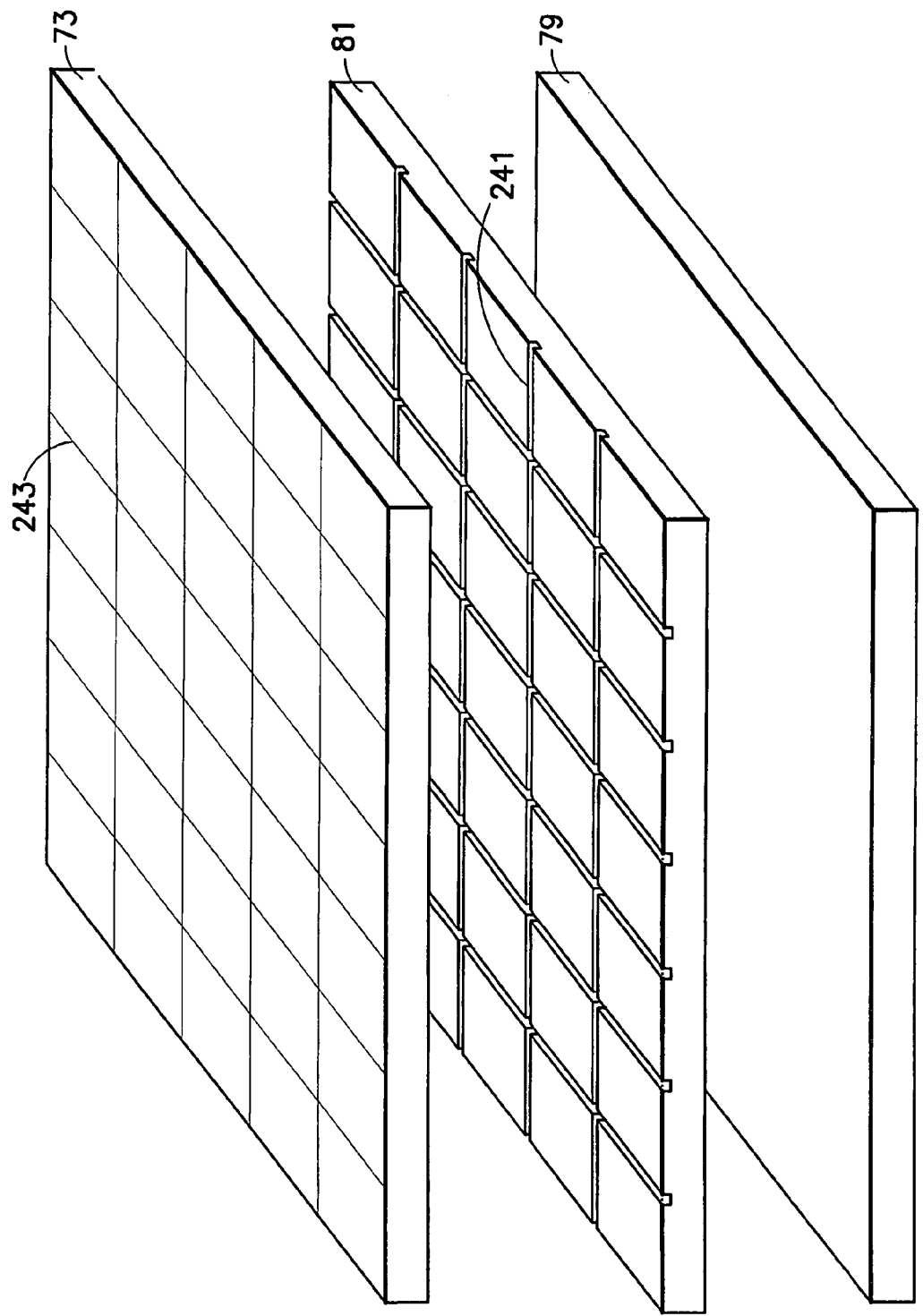
FIG. 24 is an exploded view of a WACTEM wafer assembly according to an exemplary embodiment of the invention prior to bonding.

With reference to FIG. 24 there is illustrated an exploded view of a WACTEM wafer assembly 77, prior to bonding, according to an exemplary embodiment of the invention showing the cleared metal lanes 241 on the stainless steel shim 81 arranged in accordance with a pattern, for example a grid pattern. Note that the saw lanes 243 of the ROIC 73 are formed in accordance with the same pattern and are aligned with the cleared metal lanes 241 on the stainless steel shim 81 prior to bonding.

Figure 7:
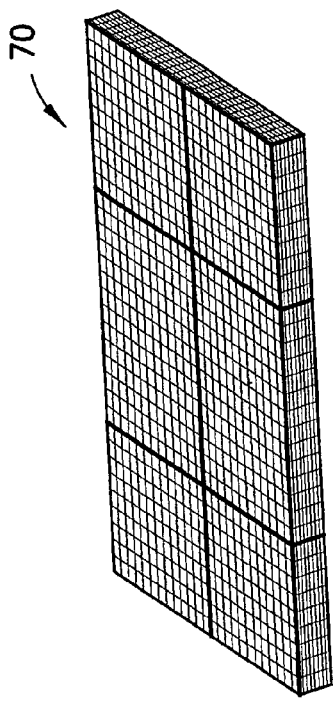
FIG. 7 is a perspective view of an ANSYS® half-symmetry model of a SCA incorporating a Wafer Coefficient of Thermal Expansion Matching (WACTEM) wafer assembly according to an exemplary embodiment of the invention.
Figure 8:
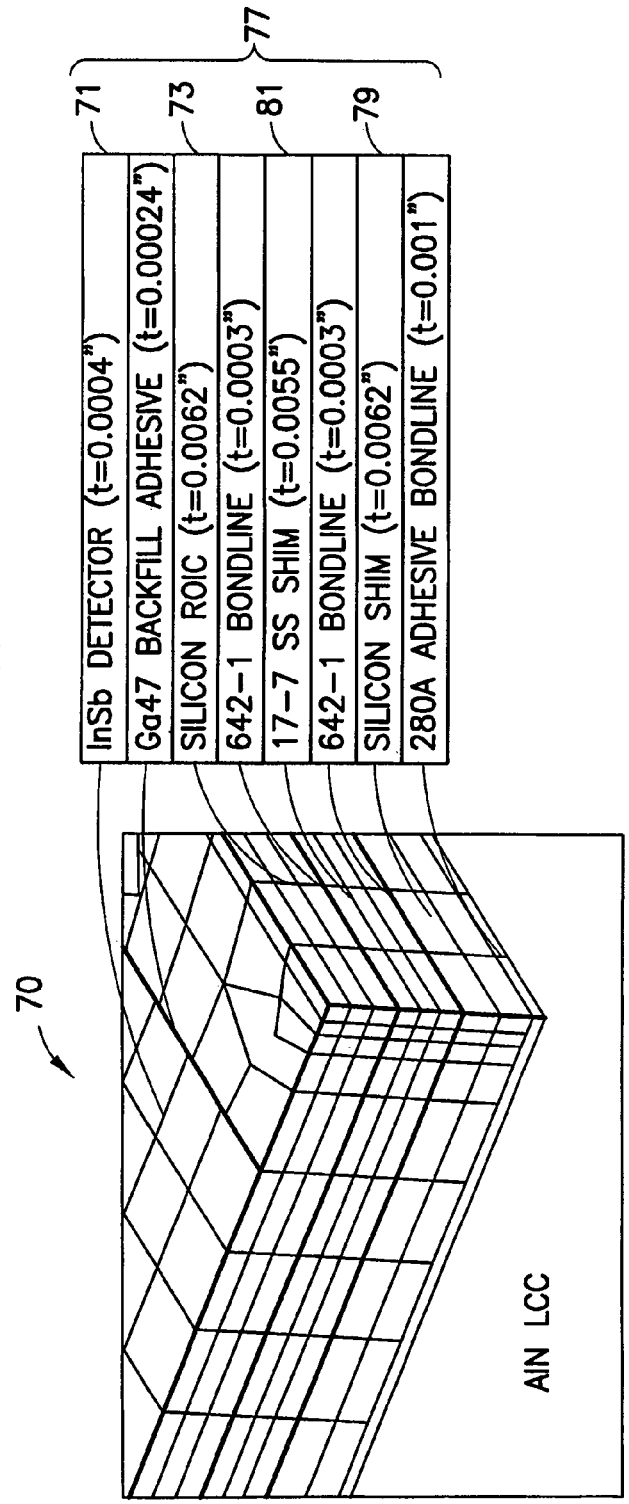
FIG. 8 is a perspective view of an ANSYS® half-symmetry model of a SCA incorporating a WACTEM wafer assembly according to an exemplary embodiment of the invention showing the exemplary component materials.

With reference to FIG. 7, there is illustrated an image of a half-symmetry three-dimensional ANSYS® finite element model used in a study of an exemplary embodiment of a stainless steel SCA 70 formed of a WACTEM wafer assembly 77 according to an exemplary embodiment of the invention. The results of the study are depicted in the following figures as described below. With reference to FIG. 8, there is illustrated a detailed image of the model mash of the stainless steel SCA 70 according to an exemplary embodiment of the invention. The illustrated model consists of 83,000 type 186 20-noded solid elements. As illustrated, detector 71 is bonded to the WACTEM wafer assembly 77 via a backfill adhesive. The WACTEM wafer assembly 77 is formed of a central stainless steel shim 81 bonded on one side to silicon ROIC 73 and on another side to silicon shim 79. The material properties used in the model are shown in FIG. 9.

Figure 1:
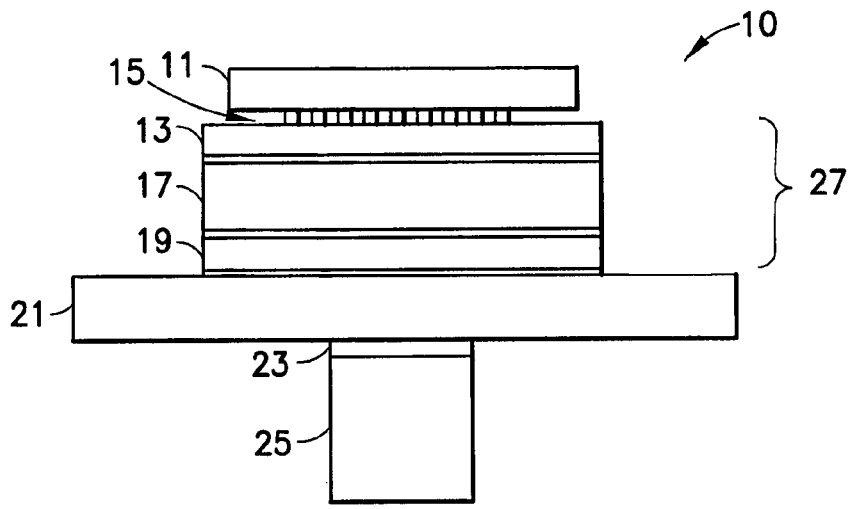
FIG. 1 is a diagram of a sensor chip assembly (SCA) known in the art.
Figure 2:
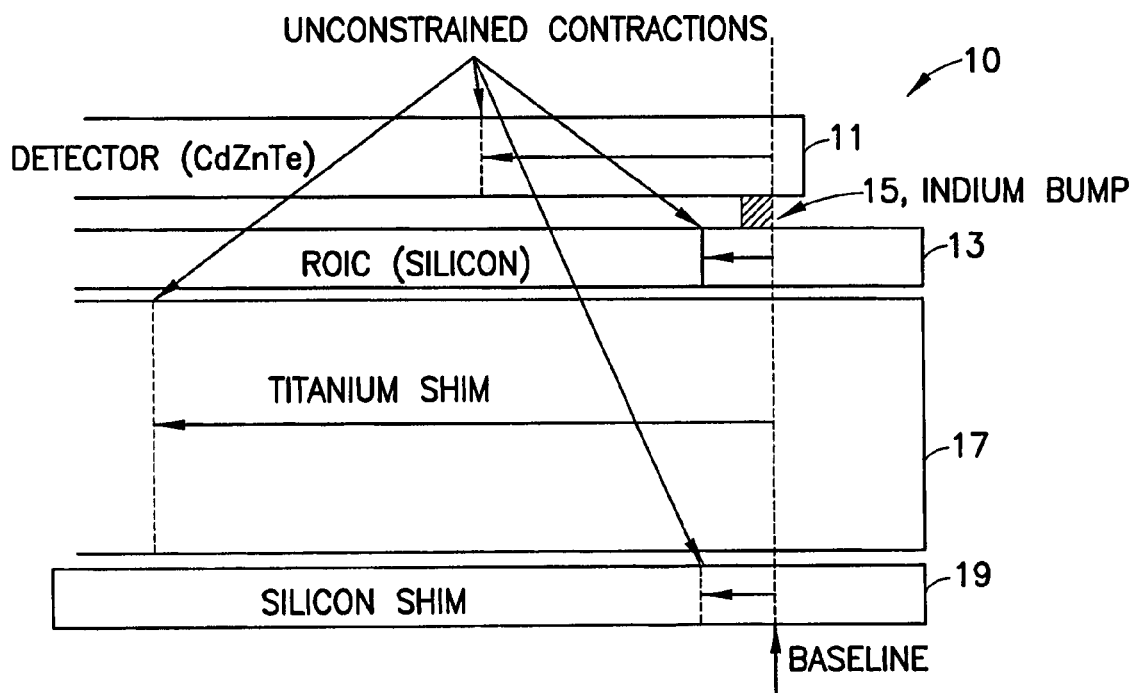
FIG. 2 is a cross-section diagram of the SCA of FIG. 1.
Figure 5:
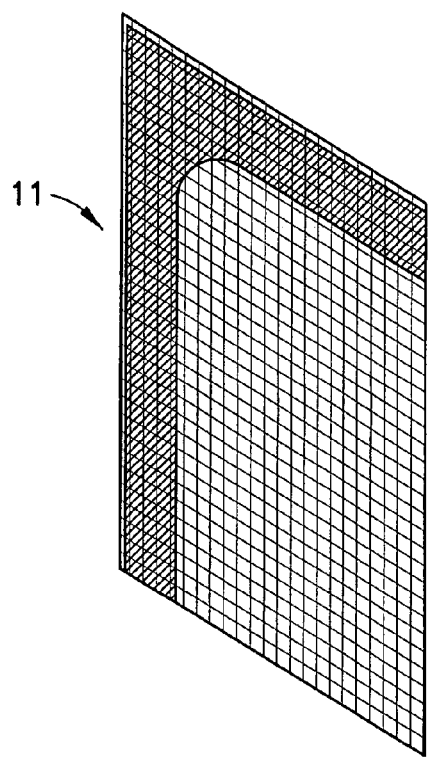
FIG. 5 is a perspective view of an InSb detector known in the art showing the maximum principal press generated when cooled from 300K to 77K.
Figure 6:
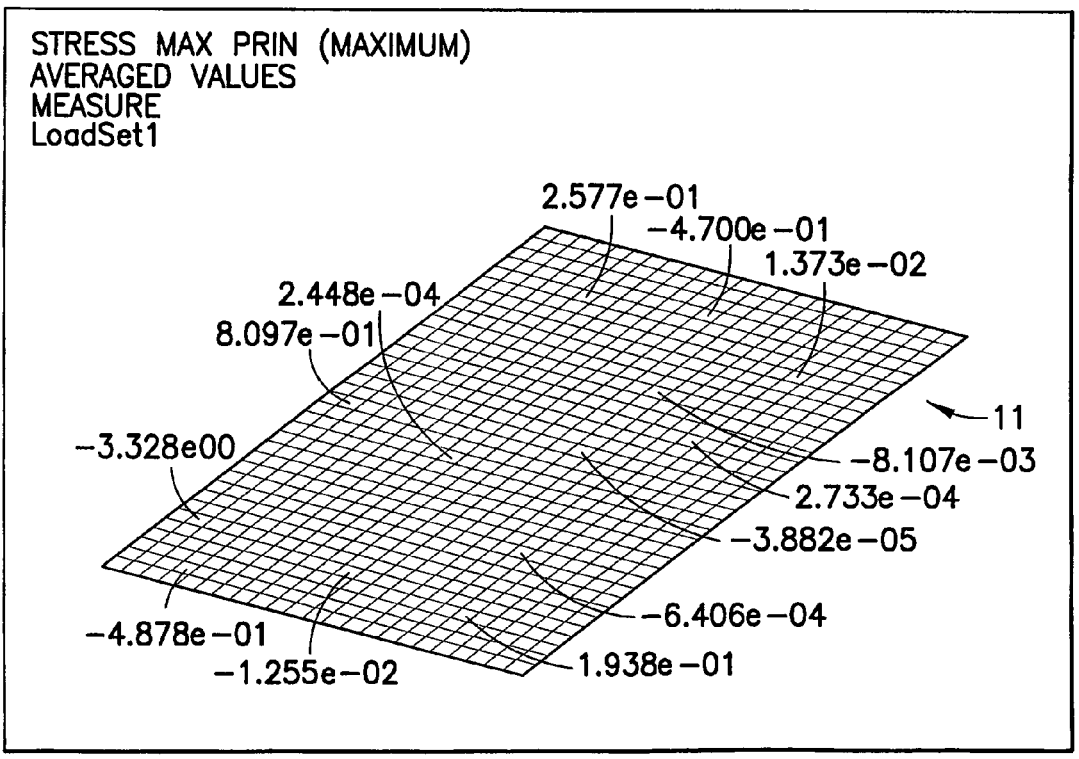
FIG. 6 is a perspective view of an InSb detector showing field stress when cooled from 300K to 77K.
Figure 10:
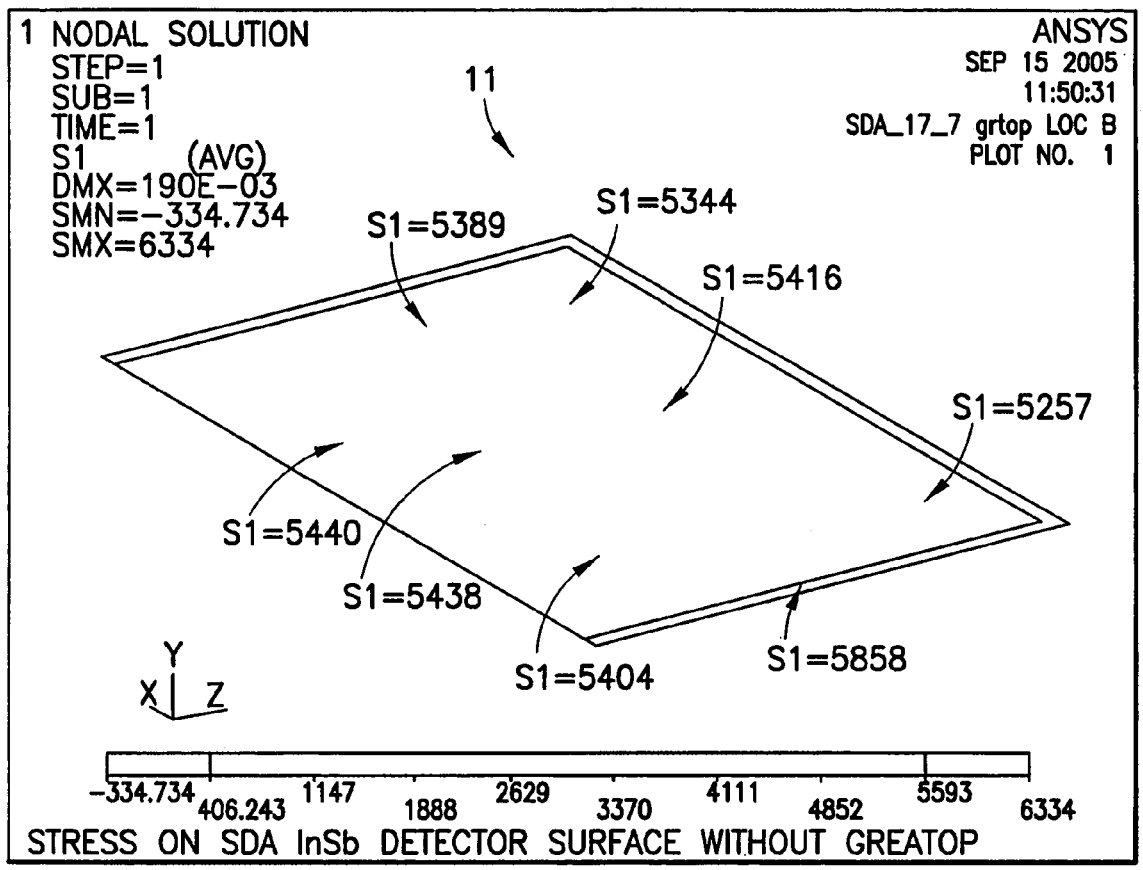
FIG. 10 is a perspective view of the maximum principal stress on a InSb detector surface.
Figure 11:
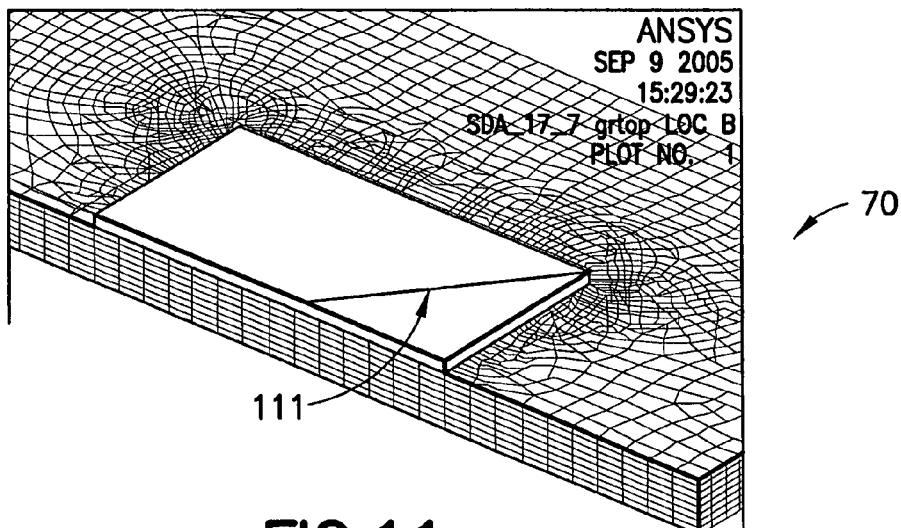
FIG. 11 is an illustration of a stress line across the InSb detector surface of FIG. 10.
Figure 12:
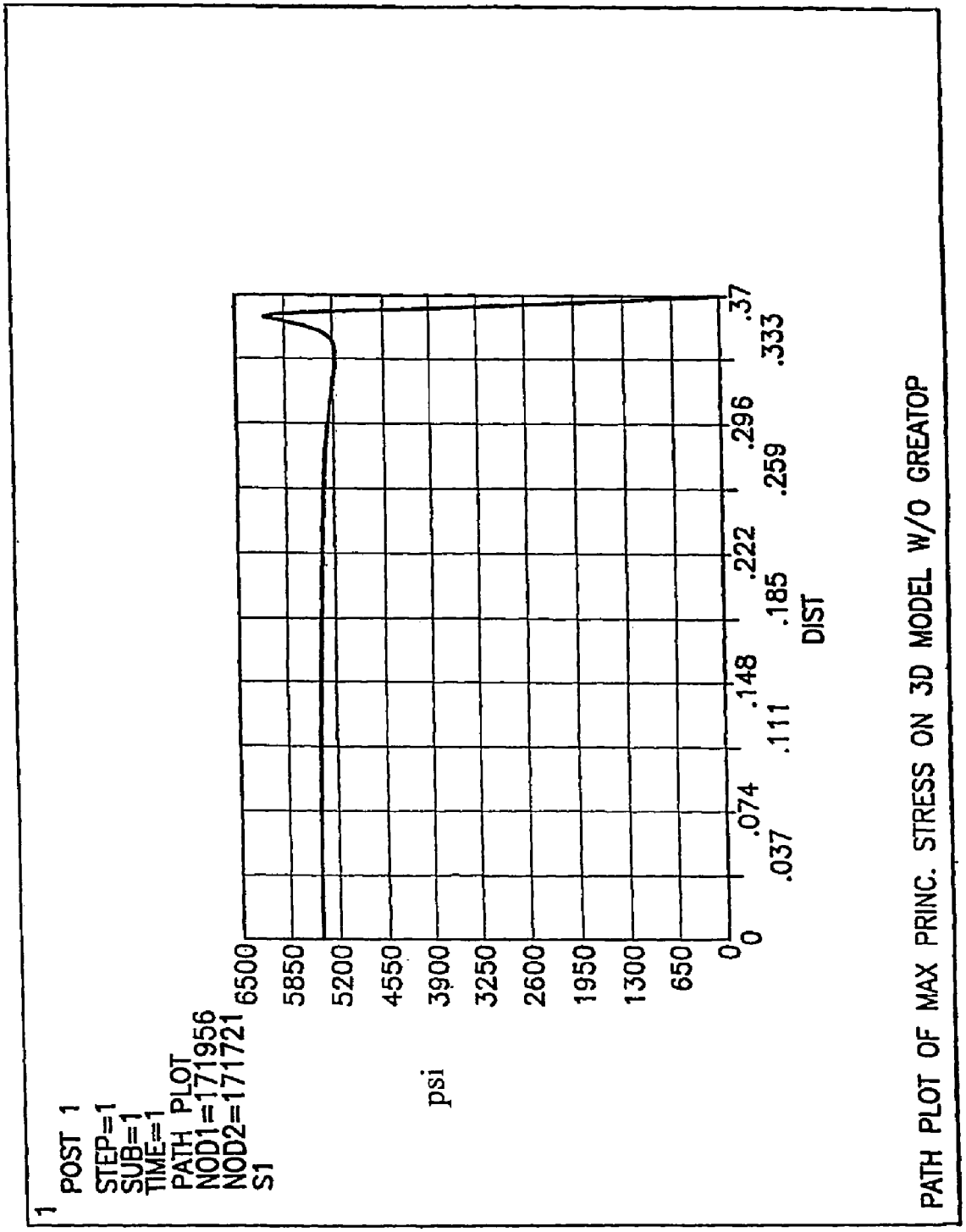
FIG. 12 is an X-Y plot of the maximum principal stress along the stress line of FIG. 11.

In order to observe the improved material characteristics of the WACTEM wafer assembly 77 with respect to the computer models described above, such as in FIG. 5, an ANSYS® model of the detector 11 of FIG. 5 was constructed. With reference to FIG. 10, there is illustrated the maximum principled stress distribution in the InSb detector 11 of FIG. 5 calculated using an ANSYS 3-D model wherein the model is similarly subjected to a cooling from 300 to 77K As is evident, the calculated maximum principled stress distribution in the InSb detector 11 is very similar to the stress calculated previously. To obtain more quantitative information on the stress distribution on the top of the detector 11, the stress along a specific line 111 on the top of the detector 11, as shown in FIG. 11, is graphed. With reference to FIG. 12, there is illustrated a X-Y plot of the maximum principal stress along the line 111 shown in FIG. 11. The plot of FIG. 12 indicates that the field stress on the surface of the SDA detector is approximately 5,400 psi with a peak stress of approximately 6,000 psi. This result is broadly consistent with the results illustrated above in reference to FIG. 5.

Figure 13:
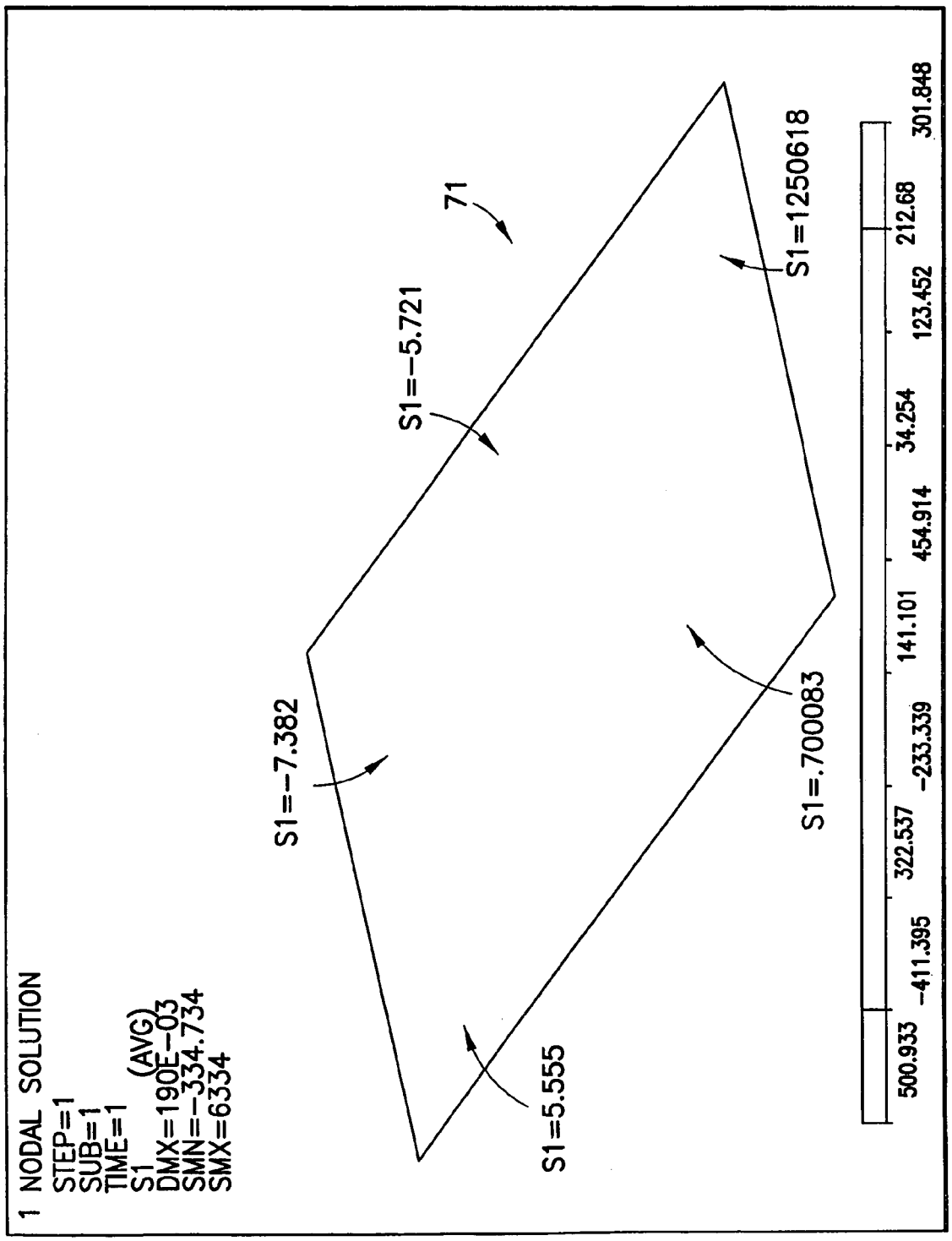
FIG. 13 is a perspective view of a contour plot of maximum principal stress of a SCA incorporating an exemplary embodiment of a WACTEM wafer assembly of the invention.
Figure 14:
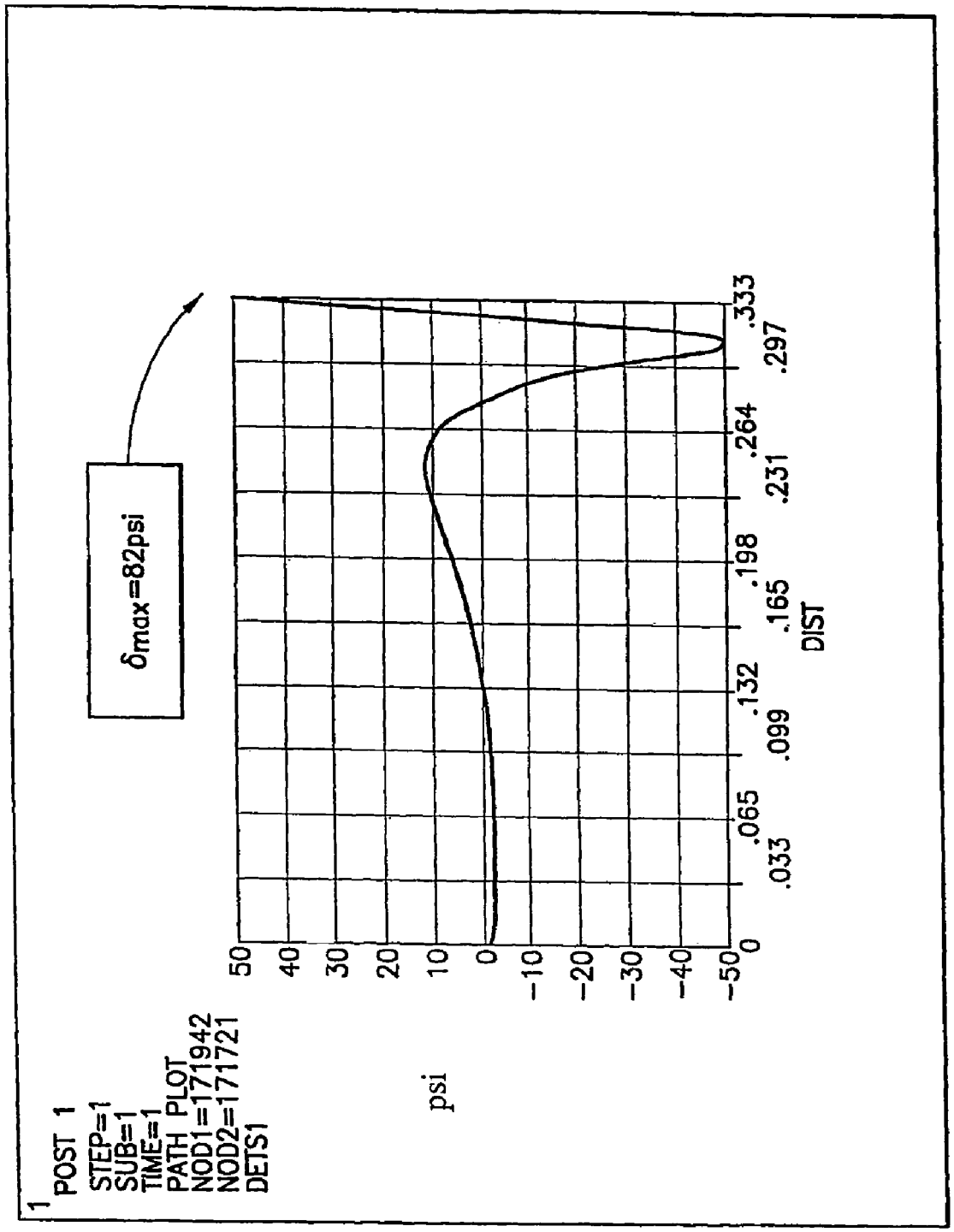
FIG. 14 is an X-Y plot of the maximum principal stress along a detector surface plot path of the SCA of FIG. 13.

With reference to FIG. 13, there is illustrated a contour plot of the maximum principal stress on the detector 71 surface bonded to an exemplary embodiment of the WACTEM wafer assembly 77 of the invention. The maximum stress on the detector 71 is approximately 300 psi and the field stress is less than 10 psi. With reference to FIG. 14, there is shown a more quantitative look at the stress along a diagonal line of the detector 71 corresponding to the line shown in FIG. 11. The field stress in FIG. 14 shows a maximum field stress of just over 10 psi and a peak stress of 82 psi at the edge of the detector 71.

Figure 15:
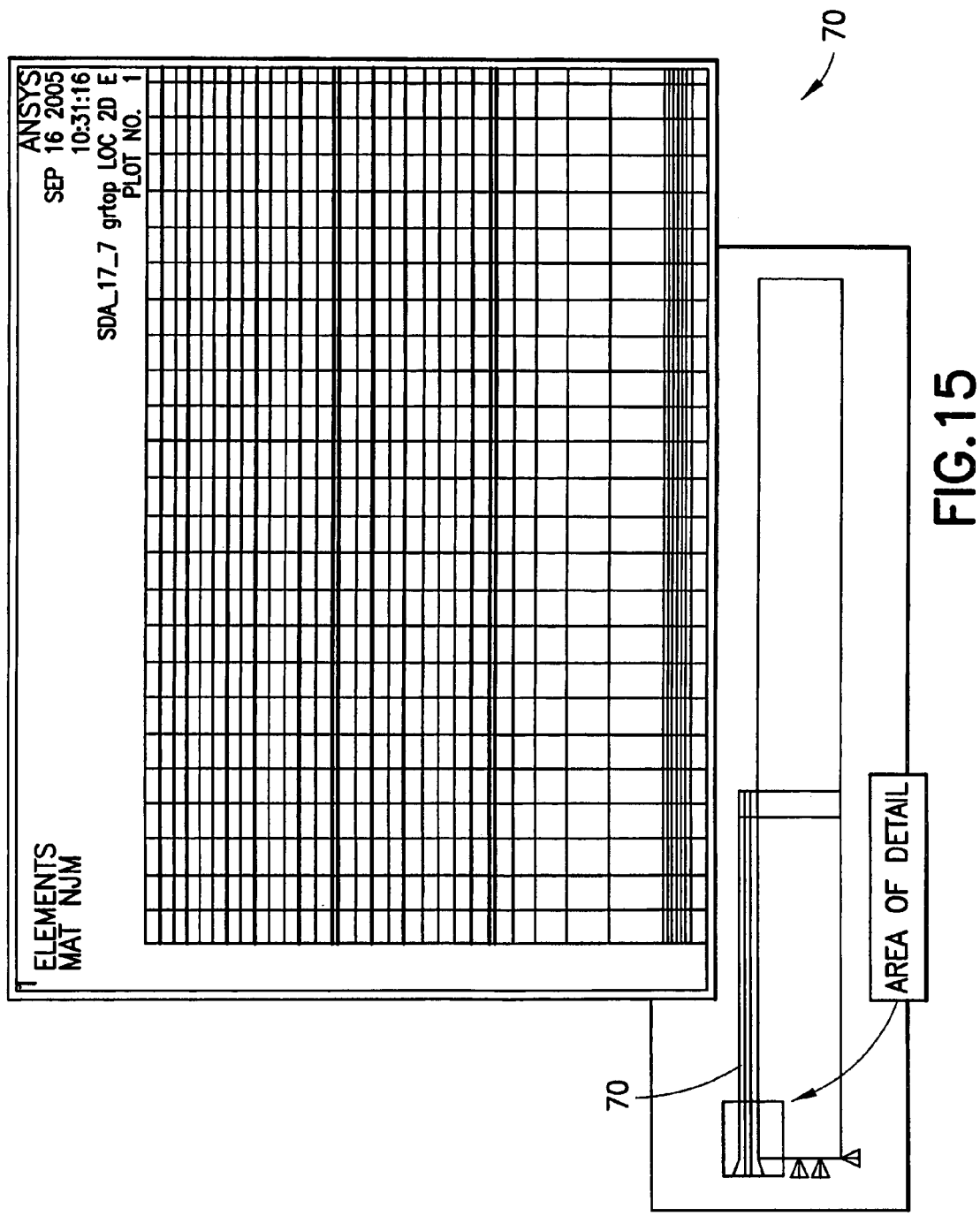
FIG. 15 is a cross-section view of 2D ANSYS® model of the SCA of FIG. 13.
Figure 16:
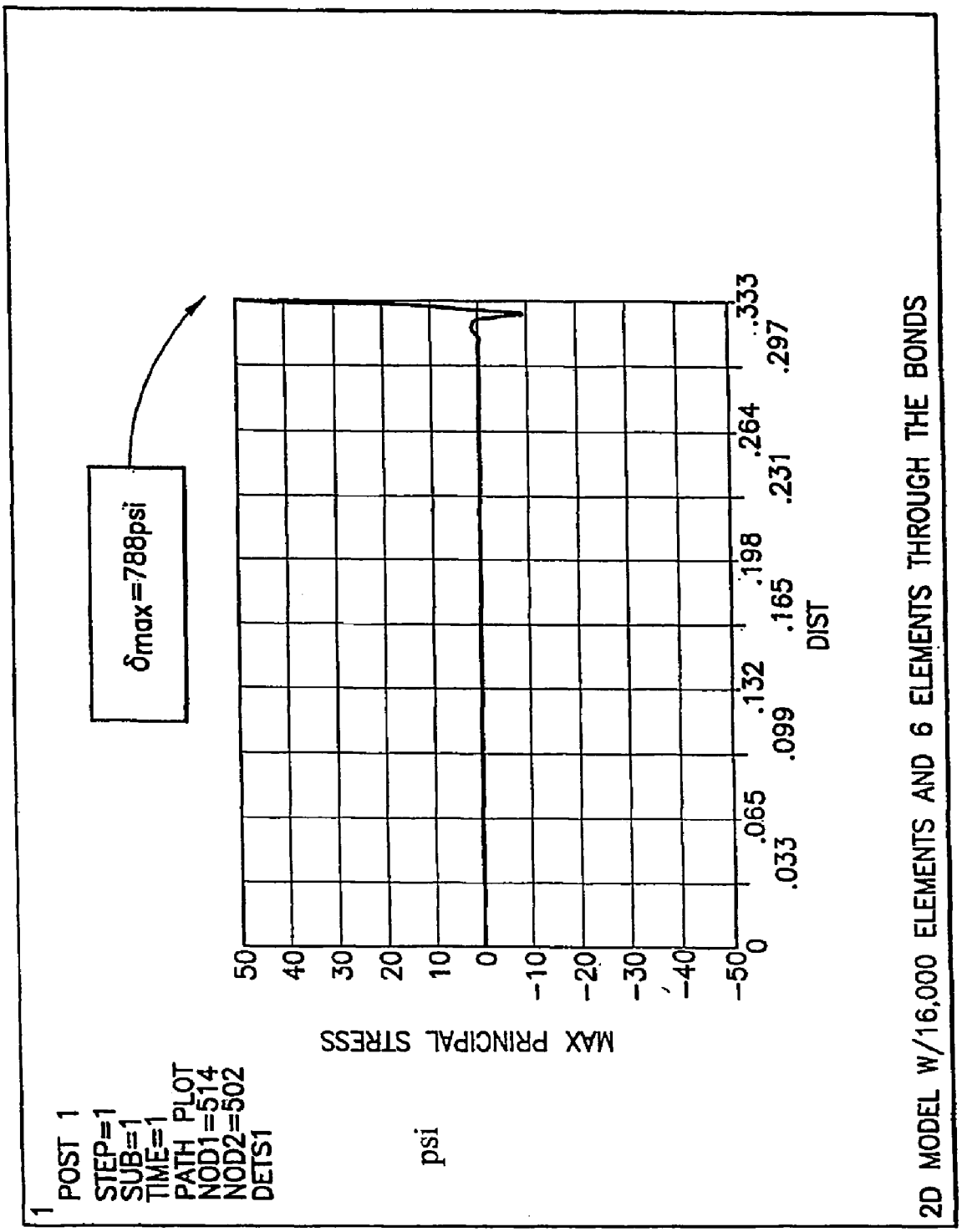
FIG. 16 is an X-Y plot of the maximum principal stress along a detector surface plot path of the SCA of FIG. 15.

With reference to FIG. 15, there is illustrated a high densify two-dimensional axisymmetric finite element analysis model of a cut through a 3-D model of the exemplary stainless steel SCA 70 shown in FIG. 13 along the same diagonal used for plotting X-Y results as shown in FIG. 14. For the high density 2D axisymmetric model, 16,000 8-noded plane-82 type elements were used. The 2D model yielded a stress distribution along the surface of the detector 71 of approximately 0 psi in the field with a peak stress of 788 psi at the edge of the detector as illustrated with reference to FIG. 16.

Figure 17:
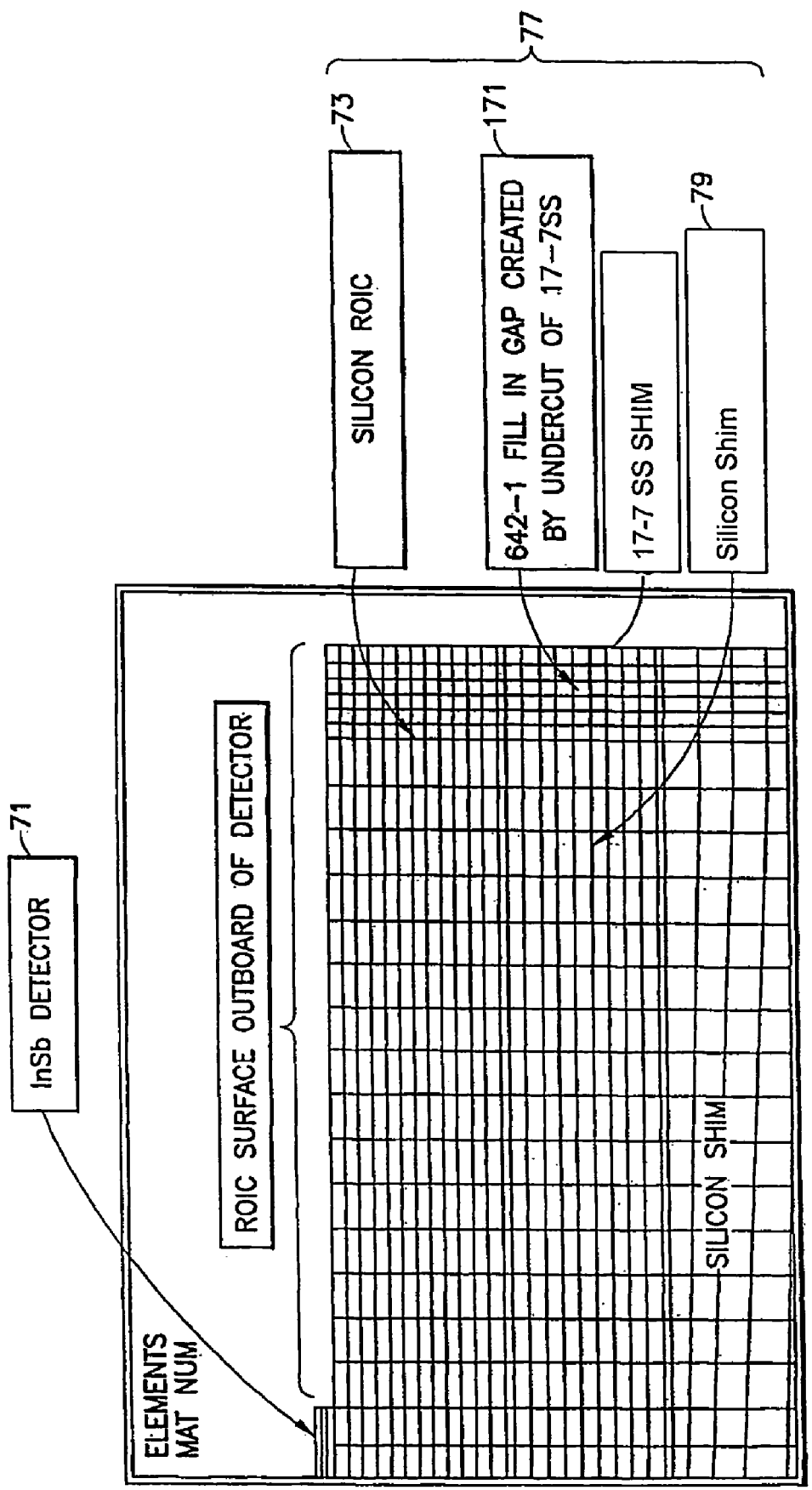
FIG. 17 is a cross-section view of 2D ANSYS® model of a SCA according to an exemplary embodiment of the invention showing a stainless steel undercut.

The WACTEM wafer assembly 77 according to exemplary embodiments of the invention provides clearance between the stainless steel shim and the saw lines of approximately 0.002" or greater on either side of each saw line. The clearance is required if the full assembly is to be diced using a diamond blade. With reference to FIG. 17, there is illustrated a 0.002" undercut of the stainless steel shim 81 formed relative to the adjacent silicon ROIC 73 and silicon shim 79. In the exemplary embodiment shown, the resulting gap is shown filled with adhesive 171.

As evidenced by the disclosure above, exemplary embodiments of the WACTEM wafer assembly 77 reduce thermal stress in InSb detectors to insubstantial levels during cooldown by matching the CTE of the composite ROIC structure with InSb material. As a result, there is realized a reduction in the rate of "infant mortality" cracking. Exemplary embodiments of the invention allow one to employ commercially available processes to assemble the WACTEM wafer assembly 77. In addition, by leaving the saw lanes devoid of metal, standard dicing procedures can be employed to singulate and dice the WACTEM wafer assemblies 77. The resulting WACTEM wafer assemblies 77 exhibit improved thermal cycle reliability for InSb focal plane assemblies or any other type of detector having a CTE in excess of $2 \times 10^{-6}$ m/m/° K as well as improved reflow hybridization capability.

Figure 20:
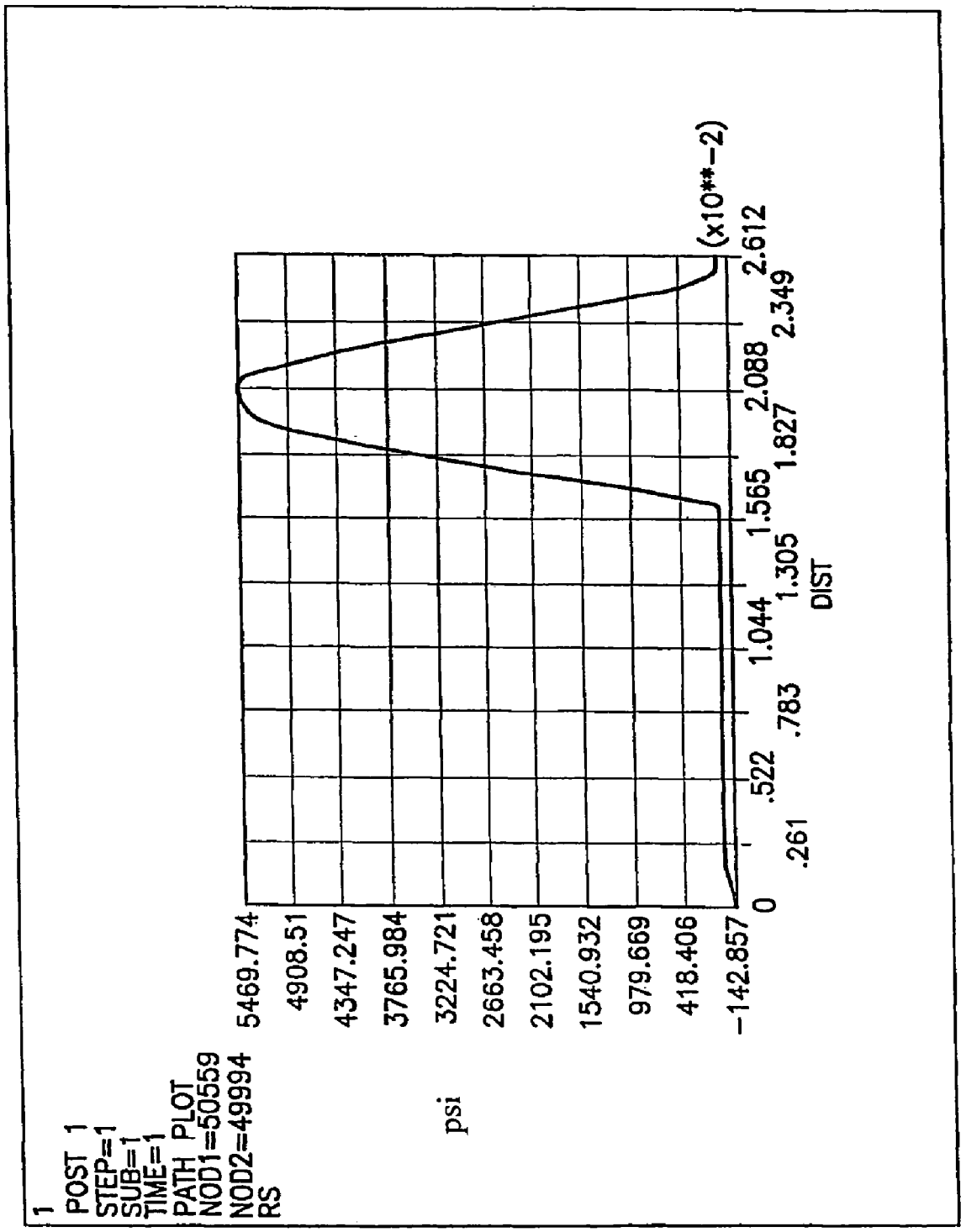
FIG. 20 is an X-Y plot of the maximum principal stress along a detector surface plot path of an SCA coupled to a WACTEM wafer assembly according to an exemplary embodiment of the invention.
Figure 21:
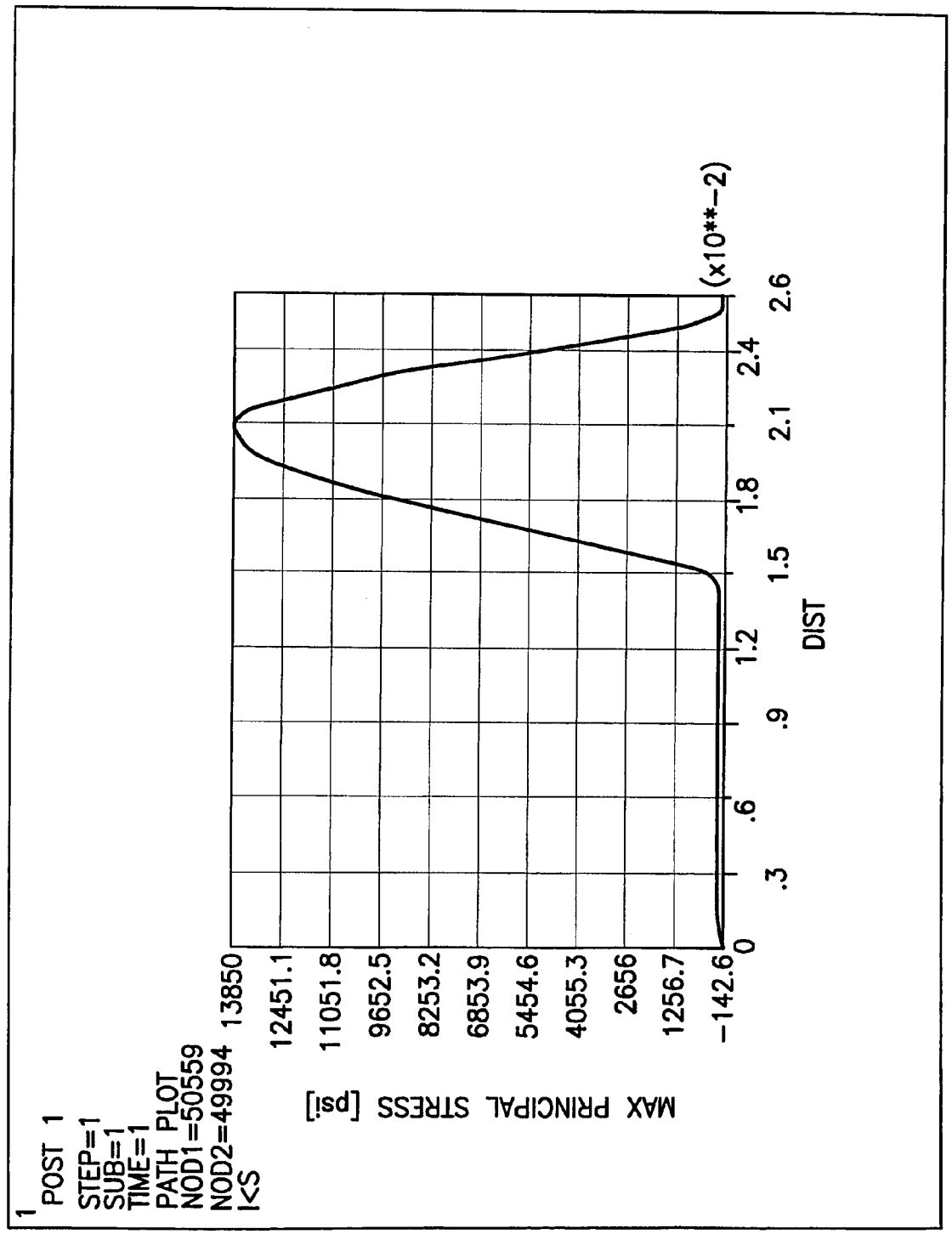
FIG. 21 is an X-Y plot of the maximum principal stress along a detector surface plot path of an SCA coupled to a WACTEM wafer assembly according to an exemplary embodiment of the invention.
Figure 22:
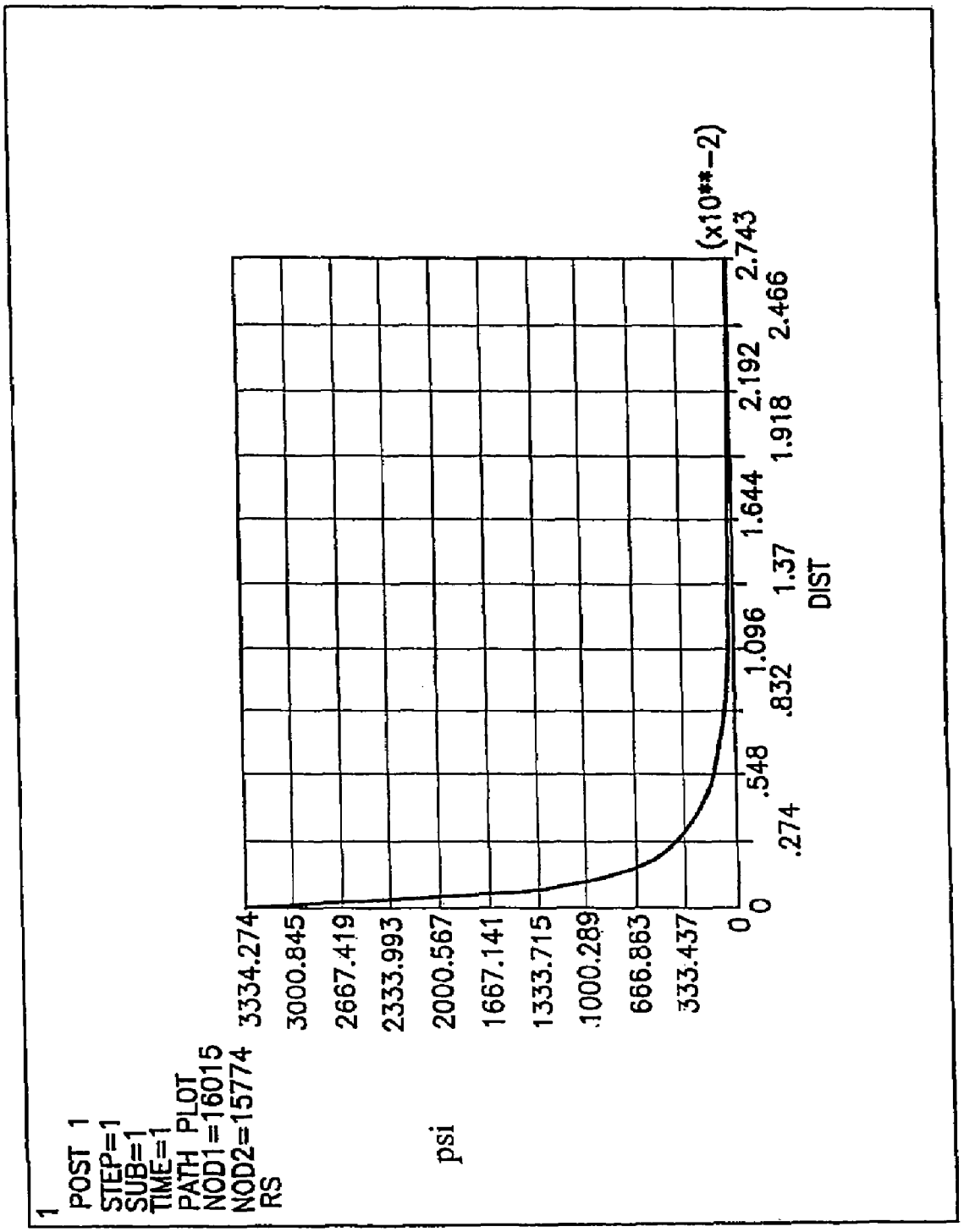
FIG. 22 is an X-Y plot of the maximum principal stress along a detector surface plot path of an SCA.
Figure 23:
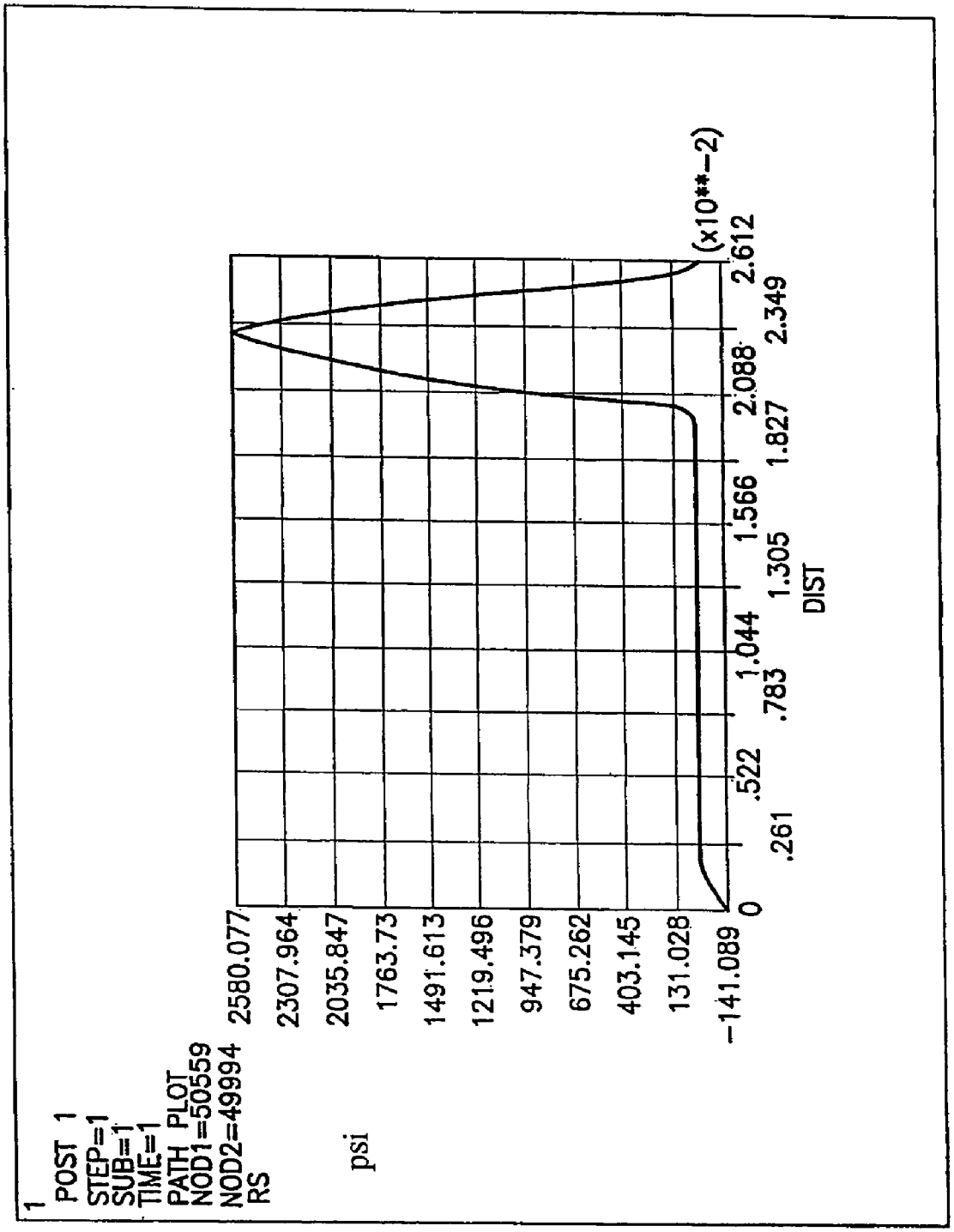
FIG. 23 is an X-Y plot of the maximum principal stress along a detector surface plot path of an SCA incorporating a WACTEM wafer assembly according to an exemplary embodiment of the invention.

FIGS. 20, 21, and 23 show X-Y plots of the maximum principal stress along a detector surface plot path of the SCA 70 coupled to a WACTEM wafer assembly. FIG. 22 shows a X-Y plot of the maximum principal stress along a detector surface plot path of the SCA 70 that is not coupled to a WACTEM wafer assembly. In FIG. 20, the SCA 70 is GREATOP configured with a stainless steel shim 81 and has a 0.002" undercut relative to the ROIC 73 and the silicon shim 79. In FIG. 21, the SCA 70 is configured similarly to that of FIG. 20 with the exception that the gap adjacent to the stainless steel shim 81 is filled with adhesive 171. In FIG. 23, the SCA 70 is GREATOP configured with a stainless steel shim 81. In FIG. 22, the SCA is not GREATOP configured and has baseline geometry cooled to 77 K.

The foregoing teachings have been described in the context of various dimensions, material types, wavelengths and the like, it can be appreciated that these are exemplary of the preferred embodiments, and are not intended to be read in a limiting matter upon these teachings. For example, while described in various exemplary embodiments with reference to 17-7 stainless steel, any stainless steel can be used that exhibits acceptable hardness and CTE properties for a particular composite structure. Thus, while these teachings have been particularly shown and described with respect to preferred embodiments thereof, it will be understood by those skilled in the art that changes in form and details may be made therein without departing from the scope and spirit of these teachings.

What is claimed is:

1. A wafer assembly comprising:
   a metal shim having a first side comprising a plurality of cleared metal lanes arranged in accordance with a pattern and a second side;
   a silicon shim coupled to said second side of said metal shim; and
   a readout integrated circuit having a plurality of saw lanes arranged in accordance with said pattern coupled to said first side of said metal shim to form a wafer assembly wherein said plurality of saw lanes is aligned with said plurality of cleared metal lanes.

2. The wafer assembly of claim 1 wherein said metal shim comprises a stainless steel shim.

3. The wafer assembly of claim 2 wherein said stainless steel shim comprises 17-7 stainless steel.

4. The wafer assembly of claim 1 having a thickness between approximately 460 μm and 470 μm.

5. The wafer assembly of claim 1 comprising an undercut in said metal shim with respect to said readout integrated circuit.

6. The wafer assembly of claim 5 wherein said undercut has an approximate length of 0.002".

7. The wafer assembly of claim 1 having a coefficient of thermal expansion approximately equal to $5 \times 10^{-6}$ m/m/° K.

* * * * *